United States Patent
Kobashi

(10) Patent No.: US 10,150,640 B2
(45) Date of Patent: Dec. 11, 2018

(54) COATING FILM TRANSFER TOOL INCLUDING A ROLLER FOR REMOVING DEBRIS ADHERED TO A TRANSFER ROLLER

(71) Applicant: PLUS CORPORATION, Tokyo (JP)

(72) Inventor: Yoshihiko Kobashi, Tokyo (JP)

(73) Assignee: Plus Corporation, Tokyo (JP)

( * ) Notice: Subject to any disclaimer, the term of this patent is extended or adjusted under 35 U.S.C. 154(b) by 0 days.

(21) Appl. No.: 15/435,015

(22) Filed: Feb. 16, 2017

(65) Prior Publication Data
US 2017/0247792 A1    Aug. 31, 2017

(30) Foreign Application Priority Data

Feb. 25, 2016 (JP) .................................. 2016-033778

(51) Int. Cl.
| B65H 37/00 | (2006.01) |
| B05C 17/02 | (2006.01) |
| B05C 1/08 | (2006.01) |
| C23C 16/02 | (2006.01) |
| B43L 19/00 | (2006.01) |

(52) U.S. Cl.
CPC ......... *B65H 37/007* (2013.01); *B05C 1/0804* (2013.01); *B05C 17/0202* (2013.01); *B43L 19/0068* (2013.01); *C23C 16/0227* (2013.01); *B05C 1/0834* (2013.01)

(58) Field of Classification Search
CPC . B65H 37/007; B65D 85/02; Y10T 156/1705; B05C 17/0222
See application file for complete search history.

(56) References Cited

U.S. PATENT DOCUMENTS

| 4,453,284 A * | 6/1984 | Schleeter ................ B60S 3/063 15/97.3 |
| 5,178,717 A * | 1/1993 | Rodriguez ......... B65H 35/0033 156/523 |
| 5,620,544 A * | 4/1997 | Cram ................. B65H 19/2207 156/184 |
| 6,510,884 B1 * | 1/2003 | Chan .................. B65H 35/0033 156/527 |
| 2002/0089113 A1 * | 7/2002 | Adema .................... B65H 3/06 271/121 |

(Continued)

FOREIGN PATENT DOCUMENTS

JP          2009-029054 A      2/2009

*Primary Examiner* — Karl Kurple
(74) *Attorney, Agent, or Firm* — The Marbury Law Group, PLLC

(57) ABSTRACT

A coating film transfer tool has a head part in order to provide a coating film transfer tool that is capable of reducing operation failure of an internal mechanism such as a rotation transmission mechanism, and improving feeling of use. The head part is provided with a transfer roller for transferring a coating film layer of a transfer tape T to a transferred surface by abutting on a back side of the transfer tape T. In addition, the head part is provided with a debris removal roller for removing debris of the coating film layer of the transfer tape T adhering to the transfer roller. The debris removal roller is disposed at a rear of the transfer roller and is arranged in close proximity to or in contact with the transfer roller.

8 Claims, 7 Drawing Sheets

(56) References Cited

U.S. PATENT DOCUMENTS

| | | | | |
|---|---|---|---|---|
| 2003/0049043 A1* | 3/2003 | Fuwazaki | ................ | B41J 13/02 399/98 |
| 2009/0026302 A1* | 1/2009 | Kinugasa | ............. | B65H 37/007 242/410 |
| 2010/0084095 A1* | 4/2010 | Sekiya | ................. | B65H 37/007 156/378 |
| 2012/0097313 A1* | 4/2012 | Odawara | ............. | B65H 37/002 156/47 |

* cited by examiner

US 10,150,640 B2

COATING FILM TRANSFER TOOL INCLUDING A ROLLER FOR REMOVING DEBRIS ADHERED TO A TRANSFER ROLLER

CROSS-REFERENCE TO RELATED APPLICATION

This application is based upon and claims the benefit of priority under 35 USC 119 of Japanese Patent Application No. 2016-033778 filed on Feb. 25, 2016, the entire disclosure of which, including the description, claims, drawings, and abstract, is incorporated herein by reference in its entirety.

BACKGROUND OF THE INVENTION

Field of the Invention

The present invention relates to a coating film transfer tool for transferring a coating film layer of a transfer tape to a transferred surface.

Description of the Related Art

Currently, coating film transfer tools applied to correction tapes or glue tapes are provided. For example, Japanese Unexamined Patent Publication No. 2009-29054 discloses a refill type transfer tool. The transfer tool has a replacement refill and a transfer tool main body. The replacement refill includes a supply reel around which an unused transfer tape is wound, a winding reel around which a used transfer tape is wound, and a transfer roller which transfers a coating film layer of the transfer tape to a transferred surface. The transfer tool main body includes a rotation transmission mechanism that is made up of a plurality of gears, etc., for interlocking the supply reel and the winding reel.

Generally, a transfer tape of the coating film transfer tools is manufactured by cutting a material roll, which has a base material on which a coating film layer is laminated, in a predetermined width. Therefore, the coating film layer of the transfer tape is laminated also on a side edge of the base material. Consequently, the coating film layer may be caused to protrude from the edge of the transfer tape since the transfer tape is pressed by the transfer roller, and may adhere to the transfer roller when in use of the transfer tool disclosed in Japanese Unexamined Patent Publication No. 2009-29054. The protruded coating film layer adhering to the transfer roller adheres back to the sequentially fed transfer tape and then may adhere to an internal mechanism of the rotation transmission mechanism as debris. This may cause operation failure of the transfer tool.

In addition, if the debris of the coating film layer has high adhesive properties, such as glue or the like, the debris is pressed against and separated from the transferred surface, such as paper along with rotation of the transfer roller when the transfer tool is in use. This may hinder the transfer roller from rolling, or make noise. Further, if the debris of the coating film layer adhering to the transfer roller is accumulated and gets bigger, the debris may adhere to the transferred surface.

SUMMARY OF THE INVENTION

An object of the present invention is to provide a coating film transfer tool capable of reducing operation failure and improving feeling of use.

The coating film transfer tool of the present invention includes a head part, a transfer roller that is disposed rotatably to the head part and abuts on a back side of a transfer tape so as to transfer a coating film layer of the transfer tape to a transferred surface, and a debris removal roller that is disposed rotatably to the head part for removing debris of the coating film layer of the transfer tape adhering to the transfer roller.

In accordance with the present invention, occurrence of such as the operation failure caused by the debris from the coating film layer is reduced since the debris from the coating film layer adhered to the transfer roller is removed by the debris removal roller. Consequently, there can be provided the coating film transfer tool capable of reducing the operation failure and improving the feeling of use.

DETAILED DESCRIPTION OF THE PREFERRED EMBODIMENT

Figure 1A:
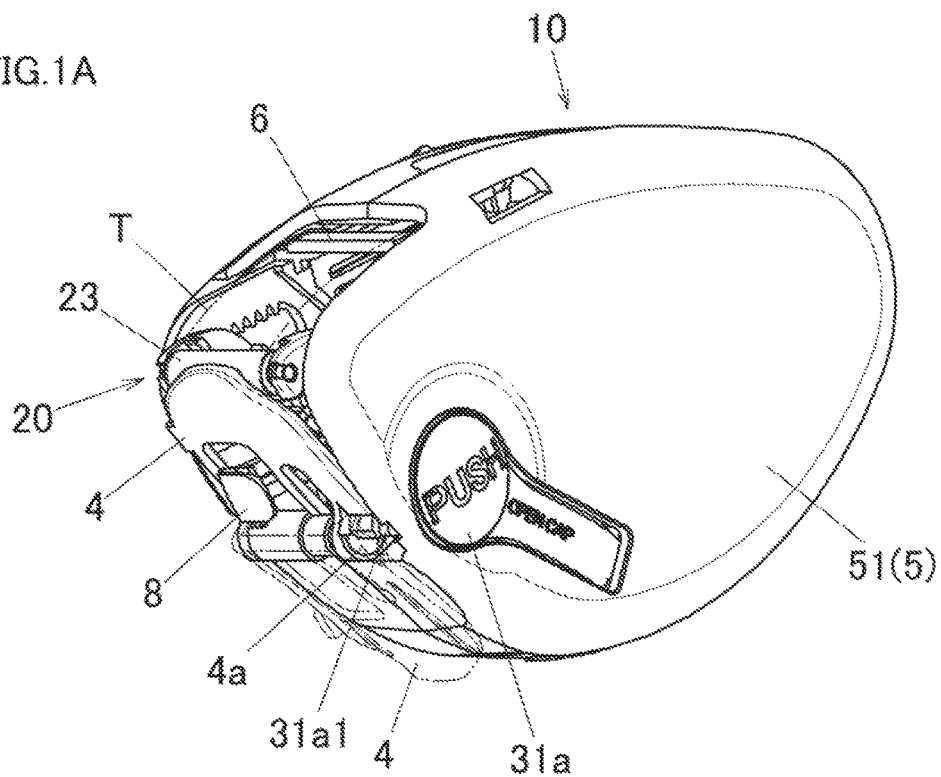
FIG. 1A is a perspective view of a coating film transfer tool seen from the front left according to an embodiment of the present invention.
Figure 1B:
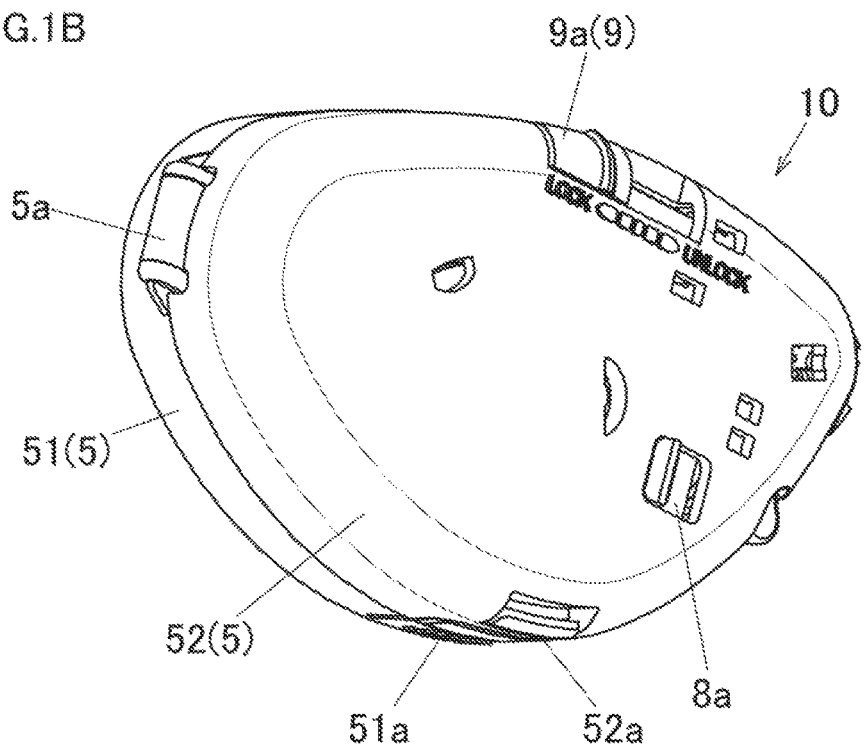
FIG. 1B is a perspective view of the coating film transfer tool seen from the rear right according to the embodiment of the present invention.

An embodiment of the present invention will be described along with the accompanying figures. FIGS. 1A and 1B are perspective views of a coating film transfer tool 10. The coating film transfer tool 10 according to the embodiment of the present invention includes a transfer tape T, which is a glue tape having a glue material layer as a coating film layer and a base material on which the glue material layer is laminated. The coating film transfer tool 10 includes a housing main body 5. An opening is defined at a front end of the housing main body 5. A head part 20 projects from the opening. The head part 20 is provided with a transfer roller 23 which is rotatably supported about its axis. The transfer roller 23 transfers the coating film layer (i.e. the glue material layer) of the transfer tape T to a transferred surface by abutting on a back side of the transfer tape T. In descriptions hereinafter, a direction where the head part 20 is provided is referred to as a front, and an opposite direction to the front is referred to as a rear. A left side of the coating film transfer tool seen from the rear is referred to as left, a right side of the coating film transfer tool seen from the rear is referred to as right, a top side in FIGS. 1A and 1B is referred to as a top, and a bottom side in FIGS. 1A and 1B is referred to as a bottom.

The housing main body 5 is formed convexly curved at both the top and bottom sides in such a manner that the bottom side bulges larger than the top side in a side view. A front side of the housing main body 5 is formed converging more sharply than a rear side of the housing main body 5 in the side view. A cap member 4 in a substantially flat plate shape is rotatably provided to a front bottom side of the housing main body 5. The opening is defined on the front of the housing main body 5 and the head part 20 projects from the opening. A cap release button 31a is disposed to a left side surface of the housing main body 5 so as to be exposed from an inside of the housing main body 5. A cap locking part 31a1 is formed on a front bottom side of the cap release button 31a which is located on a left end side of a rotating shaft of the cap member 4.

A distal end of the cap member 4 covers the transfer roller 23 when the cap member 4 is in a "closed" position shown by a solid line in FIG. 1A. When the cap member 4 covers the transfer roller 23, the cap locking part 31a1 of the cap release button 31a is locked with a cap locked part 4a provided to the cap member 4 for restricting the cap member 4 from rotation. By a circular portion of the cap release button 31a having characters "PUSH" being pushed, the cap locked part 4a is unlocked from the cap locking part 31a1, and therefore the cap member 4 is allowed to rotate. When the cap member 4 is positioned in an "open" position, which is shown by dash-double-dotted line in FIG. 1A, after pressure on the cap release button 31a is released and the cap member 4 is rotated, the cap locking part 31a1 is locked with the cap locked part 4a again for restricting the cap member 4 from rotation. The coating film transfer tool 10 is used with the cap member 4 being in the "open" position as described above.

Figure 2:
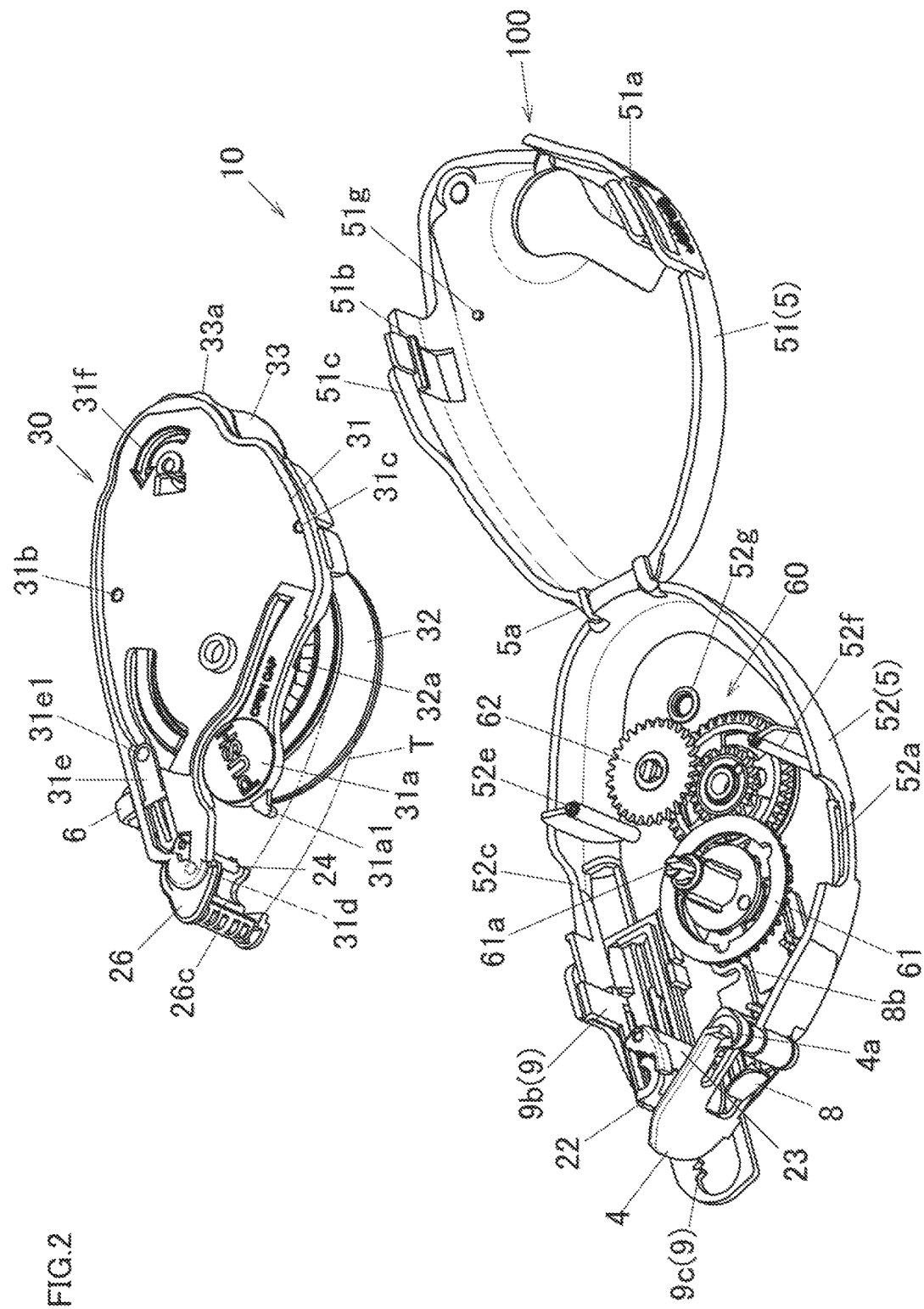
FIG. 2 is a perspective view showing a state where the coating film transfer tool and a replacement refill are separated according to the embodiment of the present invention.

More specifically, the cap locking part 31a1 has a rightward projection as shown in FIG. 2. A distal end of a plate-like part of the cap locked part 4a is formed bent. In the "closed" position of the cap member 4, an inner angle side of the bent cap locked part 4a is locked with the projection of the cap locking part 31a1. The cap locked part 4a is unlocked from the cap locking part 31a1 by the cap release button 31a being pushed. When the cap member 4 is continued to be rotated after the pressure on the cap release button 31a is released, the cap locked part 4a is locked with the projection of the cap locking part 31a1 along an outer angle side of the bent cap locked part 4a. The cap member 4 is moved from the "open" position to the "closed" position by rotating the cap member 4 by hand.

A transfer guide member 8 is disposed to a front lower side of the transfer roller 23 as shown in FIG. 1A. The transfer guide member 8 is designed to be projected and retracted by a guide member projecting and retracting lever 8a exposed in a right surface of the coating film transfer tool 10 shown in FIG. 1B. A distal end of the transfer guide member 8 is formed in a flat plate shape bent in a substantially L-shape. The distal end of the transfer guide member 8 is energized by an elastic part 8b (refer to FIG. 2). The transfer guide member 8 is projected from the housing main body 5 when the coating film transfer tool 10 is in use. The distal end of the transfer guide member 8 formed in the flat plate shape bent in the substantially L-shape is slipped beneath the transferred surface such as paper so that a transfer operation can be performed along an edge of the transferred surface such as paper.

The housing main body 5 of the coating film transfer tool 10 is constituted of a left casing 51 and a right casing 52. The left casing 51 and the right casing 52 are formed in a substantially shell shape. The left casing 51 and the right casing 52 are connected together by a hinge part 5a at their rear end parts. In order to open the housing main body 5, first, move an opening and closing operation part 9a toward the front as shown in FIG. 1B. Next, depress a locking part 51a disposed to a bottom surface of the housing main body 5 for releasing a lock between the left casing 51 and the right casing 52, whereby the housing main body 5 is opened as shown in FIG. 2.

FIG. 2 is a perspective view showing a state where the housing main body 5 of a coating film transfer tool main body 100 is opened and a replacement refill 30 is removed from the housing main body 5. In the following descriptions of FIG. 2, up, down and left, right directions mean the up, down and left, right directions in an assembled state of the coating film transfer tool 10 shown in FIGS. 1A and 1B. The locking part 51a in a flat plate shape is erected on a lower edge of the left casing 51 of the coating film transfer tool main body 100 toward the right. In addition, a locked part 52a is provided to a lower edge of the right casing 52. The locked part 52a is a through hole into which a hooked distal end of the locking part 51a of the left casing 51 is inserted. The opening and closing operation part 9a (refer to FIG. 1B) is provided to a substantially flat shaped opening and closing member 9 disposed on an upper front side of the right casing 52. The opening and closing member 9 is longitudinally movably disposed with flat surfaces of the opening and closing member 9 facing the left and right. A locking part 9b in a flat plate shape is erected on the left side of the opening and closing member 9 toward the left with flat surfaces of the locking part 9b facing up and down. The locking part 9b is locked with a locked part 51b in a hooked shape provided to an upper edge of the left casing 51 when the opening and closing operation part 9a is in a locked state.

An engaging plate part 51c in a flat plate shape is erected on the upper edge of the left casing 51 toward the left. In addition, an engaging recessed part 52c is formed on an upper edge of the right casing 52. In a closed state of the housing main body 5, the left casing 51 and the right casing 52 are positioned with respect to each other by the engaging plate part 51c of the left casing 51 and the engaging recessed part 52c of the right casing 52 being engaged together.

A rotation transmission mechanism 60 having a plurality of gears and clutch, etc. is provided to an inside of the right casing 52 (housing main body 5). Each gear of the rotation transmission mechanism 60 is rotatably supported by a corresponding gear support shaft (for example, a gear support shaft 61a corresponding to a gear 61) erecting from an internal surface of the right casing 52 toward the left. Rotational force of a supply bobbin, which will be described later, is transmitted to a take-up bobbin 33 by the rotation transmission mechanism 60.

Figure 5:
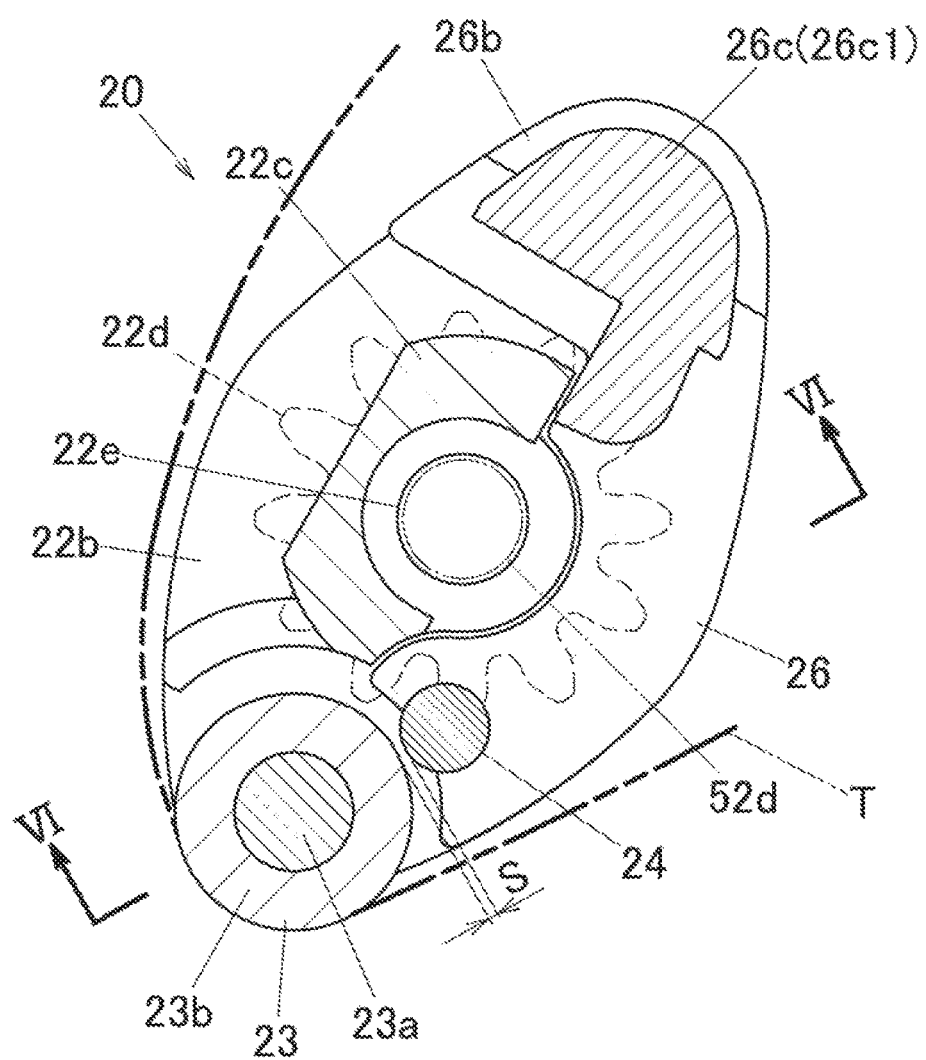
FIG. 5 is a cross sectional view of the head part of the coating film transfer tool according to the embodiment of the present invention taken along line V-V of FIG. 4A.
Figure 6:
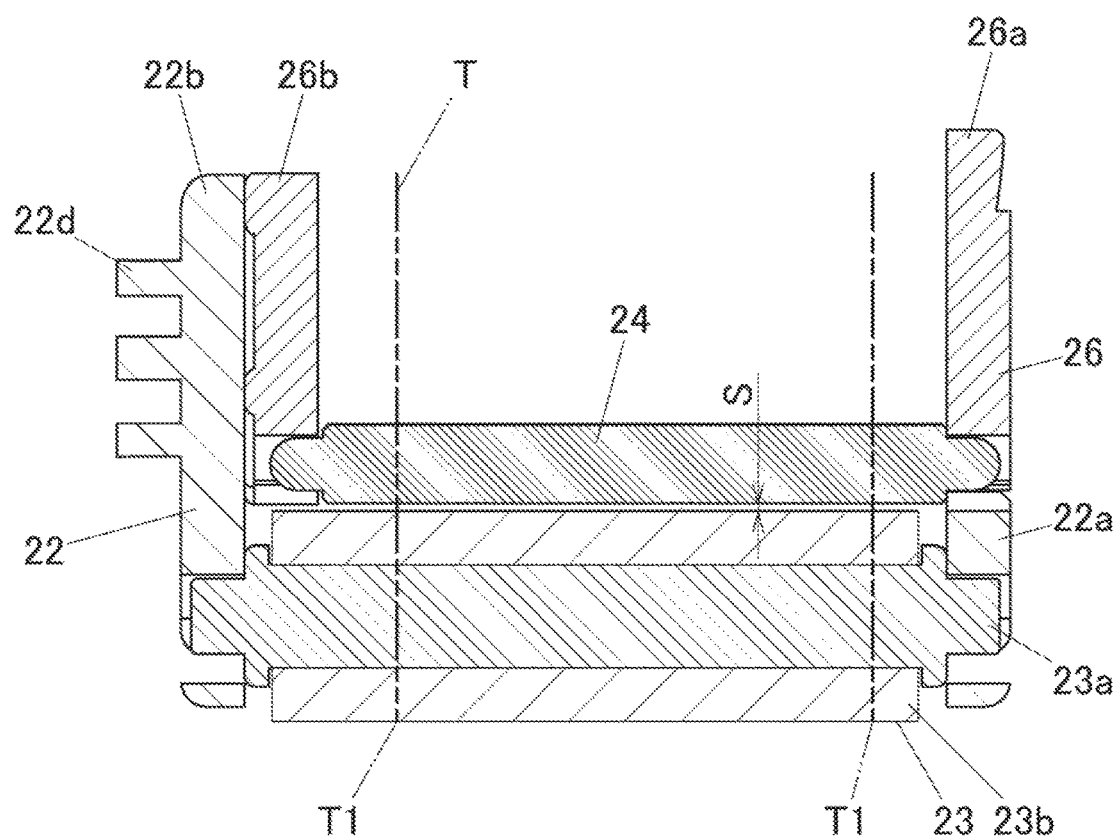
FIG. 6 is a cross sectional view of the head part of the coating film transfer tool according to the embodiment of the present invention taken along line VI-VI of FIG. 5.

A first head part 22 is disposed to a front end of the right casing 52. Hereinafter, descriptions will be made with referring to FIGS. 4 to 6. FIGS. 4 to 6 show the head part 20, the transfer roller 23, and a debris removal roller 24 in a condition where the head part 20 is formed by the replacement refill 30 being installed to the coating film transfer tool main body 100, and then the first head part 22 and a second head part 26 being combined.

Figure 4A:
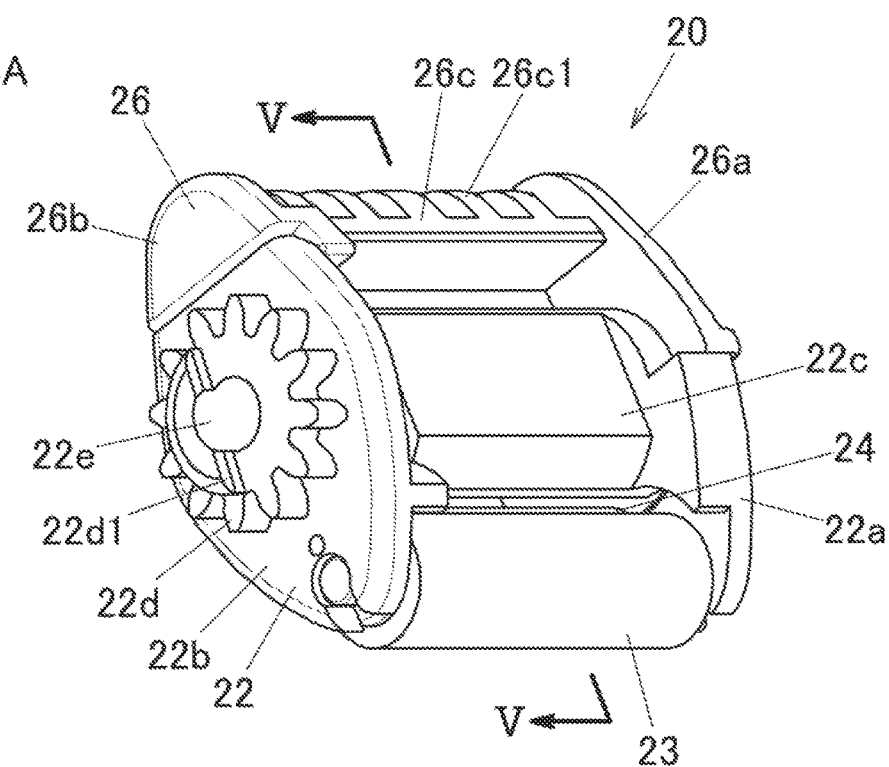
FIG. 4A is a perspective view of a head part of the coating film transfer tool according to the embodiment of the present invention seen from the upper front right, where the head part is formed by a first head part and a second head part which are combined when the replacement refill is installed to a coating film transfer tool main body.
Figure 4B:
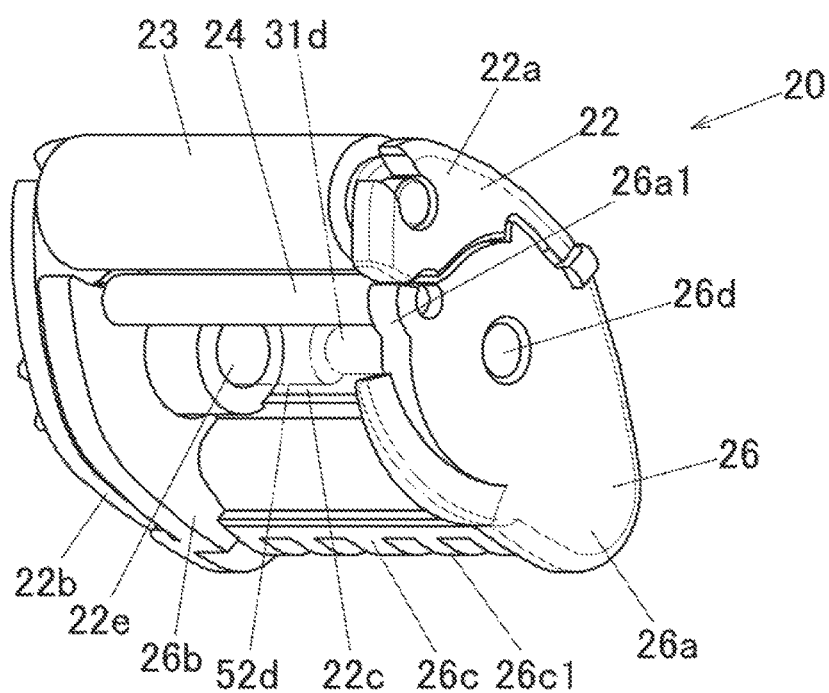
FIG. 4B is a perspective view of the head part of the coating film transfer tool according to the embodiment of the present invention seen from the lower front left, where the head part is formed by the first head part and the second head part being combined when the replacement refill is placed to the coating film transfer tool main body.

As shown in FIGS. 4A and 4B, the first head part 22 is formed by support plates 22a and 22b whose flat surfaces facing each other are connected by a left and right plate connecting part 22c. The left and right plate connecting part 22c has a space on a bottom side surface, whose longitudinal section is an upwardly convexed substantially arc shape (refer to FIG. 5). The left and right support plates 22a and 22b are each formed so as to converge forwardly, and the transfer roller 23 is rotatably supported by distal ends of the left and right support plates 22a and 22b. The transfer roller 23 is formed with a shaft part 23a made of a resin material and a roller part 23b made of silicone as shown in FIGS. 5 and 6. A pinion part 22d is formed on a right surface of the support plate 22b of the right side of the first head part 22. A step part 22d1 is formed on a right side surface of the pinion part 22d. A bearing hole 22e that runs through the pinion part 22d and the right support plate 22b is defined at the center of the pinion part 22d.

Figure 3:
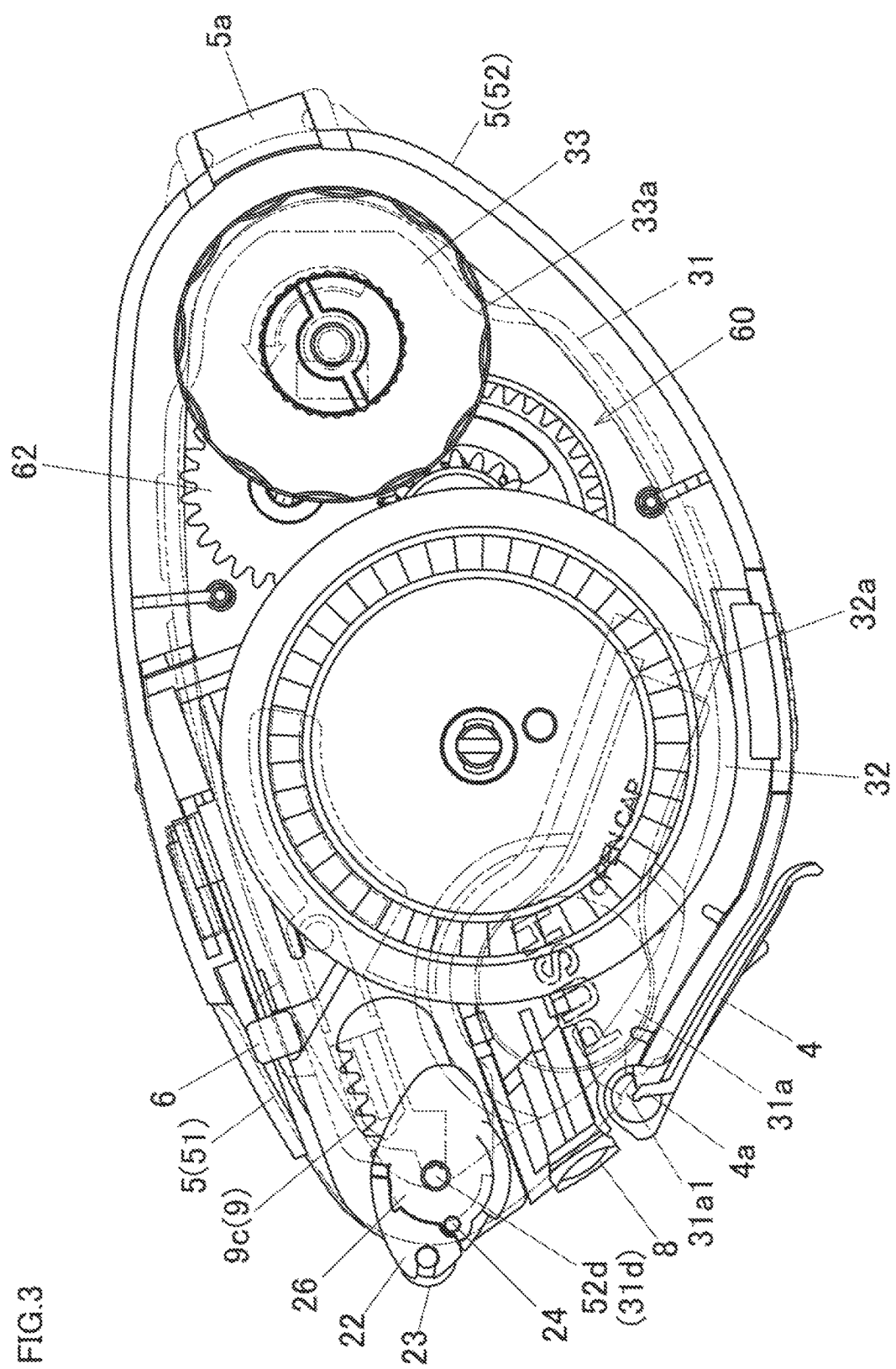
FIG. 3 is a side view of the coating film transfer tool according to the embodiment of the present invention.

A support shaft 52d is erected from the internal surface of an upper side in a vicinity of the front end of the right casing 52, toward the left as shown in FIGS. 3 and 4B. The support shaft 52d is inserted into the bearing hole 22e of the first head part 22. In addition (although not shown), a projection is formed at a base end of the support shaft 52d so as to be abuttable against the step part 22d1 formed on the right side surface of the pinion part 22d. Consequently, the first head part 22 is cantilevered rotatably by the support shaft 52d. A rack part 9c in an internal tooth shape is formed at a distal end of the opening and closing member 9 as shown in FIG. 2. The rack part 9c meshes with the pinion part 22d of the first head part 22. The transfer roller 23 of the first head part 22 is positioned on a rear side in a state where the replacement refill 30 is not installed to the coating film transfer tool main body 100.

As described heretofore, the coating film transfer tool main body 100 is formed with the housing main body 5 which is provided with the rotation transmission mechanism 60, the cap member 4, the opening and closing member 9, the transfer guide member 8, and the first head part 22.

A base plate 31 in a flat plate shape is provided to the replacement refill 30. Fixing portions 31b and 31c are provided to upper and lower positions of the base plate 31 as through holes. When the replacement refill 30 is installed to the coating film transfer tool main body 100, distal ends of fixing shafts 52e and 52f, each erecting from the internal surface of the right casing 52 toward the left, are inserted into the fixing parts 31b and 31c respectively so as to position the replacement refill 30 relative to the coating film transfer tool main body 100.

The cap release button 31a is formed on the base plate 31. The cap release button 31a has a cantilevered leaf spring so that an end part of the cap release button 31a, to which the cap locking part 31a1 is disposed, is elastically energizable.

The second head part 26 is disposed to an upper side front end of the base plate 31. As shown in FIGS. 4A and 4B, in the second head part 26, left and right support plates 26a and 26b are connected to a left and right plate connecting part 26c that is formed between flat surfaces of the left and right support plates 26a and 26b facing each other. The left and right support plates 26a and 26b are formed so as to converge rearwardly. A plurality of plate-like parts 26c1, whose longitudinal section of a rear side is a convexed arc shape, is arranged on the left and right plate connecting part 26c in the left and right directions. Therefore, one end side of the left and right plate connecting part 26c is formed in a comb-like shape viewed from above.

A bearing hole 26d is defined as a through hole on a left support plate 26a of the second head part 26. A support shaft 31d (refer to FIG. 2) erecting from a right side surface of the front end of the base plate 31 toward the right is inserted into the bearing hole 26d for cantilevering the second head part 26 rotatably. The support shaft 31d is designed so as to be coaxial with the support shaft 52d for cantilevering the first head part 22 when the replacement refill 30 is installed to the coating film transfer tool main body 100 (refer to FIG. 3). The left and right plate connecting part 26c of the second head part 26 is positioned on a front side in a state where the replacement refill 30 is not installed to the coating film transfer tool main body 100.

The debris removal roller 24 is rotatably disposed to the second head part 26. The debris removal roller 24 is formed of a hard plastic material as shown in FIGS. 5 and 6. The debris removal roller 24 is disposed at a position which is rearward of the transfer roller 23. In the position, the debris removal roller 24 does not touch the transfer tape T (in other words, a non-contact position with respect to the transfer tape T). The transfer roller 23 and the debris removal roller 24 are arranged closely to each other so as to ensure a gap S. In the present embodiment, the gap S is 0.1 mm. The debris removal roller 24 is arranged so that a center of the debris removal roller 24 in the left and right directions is off-set with respect to the transfer roller 23.

A restriction piece 31e is disposed to a position which is in a vicinity of the front end of the base plate 31 and the rear of the second head part 26, as shown in FIG. 2. The restriction piece 31e is formed in a substantially flat plate shape and a center portion of the restriction piece 31e in a longitudinal direction is connected to the base plate 31. That is to say, the restriction piece 31e is formed in such a manner that both a front end and a rear end of the restriction piece 31e swing slightly with the connected portion to the base plate 31 as a pivot point. The front end of the restriction piece 31e abuts against the second head part 26 (specifically, an abutment portion 26a1 formed in a substantially recessed shape in the left support plate 26a (refer to FIG. 4B)) so as to restrict a rotation of the second head part 26 when the replacement refill 30 is not installed to the coating film transfer tool main body 100. When the replacement refill 30 is installed to the coating film transfer tool main body 100 and the left casing 51 is closed, the front end of the restriction piece 31e is slightly moved to the left since a protrusion part 31e1 at a rear end of the restriction piece 31e is depressed by a release projection 51g formed in a projecting fashion from the internal surface of the left casing 51. Whereby the restricted rotation of the second head part 26 is released.

The supply bobbin 32 is disposed to a front side of the right side surface of the base plate 31, and the take-up bobbin 32 is disposed to a rear side of the right side surface of the base plate 31. The transfer tape T, which is unused, is wound around the supply bobbin 32. The supply bobbin 32 is rotatably cantilevered on the base plate 31. Ratchet teeth 32a are formed circularly on a left side surface of the supply bobbin 32. A ratchet pawl (not shown) is formed on a right side surface of the base plate 31, which is elastically energized toward left and right directions. A so-called reverse rotation prevention mechanism is formed by the ratchet pawl and the ratchet teeth 32a for preventing the supply bobbin 32 from rotating reversely against a feeding direction of the transfer tape T.

A used transfer tape T is wound around the take-up bobbin 33. The take-up bobbin 33 is rotatably cantilevered on the right side surface of the base plate 31. A corrugated grip part 33a is disposed in a circular shape to a circumferential edge of a left side surface of the take-up bobbin 33. The corrugated grip part 33a is used for forcibly feeding the transfer tape T by hand when the supply bobbin is stuck and does not rotate due to an unknown reason. A rotational direction of the take-up bobbin 33 by hand is in a direction of an arrow 31f that is defined on the base plate 31 as an arrow-shaped through hole. The rotation of the take-up bobbin 33 in an opposite direction to the direction of the arrow 31f is restricted by a reverse rotation prevention mechanism (not shown).

When the replacement refill 30 is installed to the coating film transfer tool main body 100, a shaft of a gear 61 is inserted into a rotational center of the supply bobbin 32, so that the gear 61 is relatively fixed to the supply bobbin 32. At this time, the take-up bobbin 33 is supported by a supporting part 52g that is formed on the internal surface of a rear side of the right casing 52. Although not shown, a gear is formed on a right side surface of the take-up bobbin 33. The gear on the right side surface of the take-up bobbin 33 meshes with a gear 62 of the rotation transmission mechanism 60.

A glue material adhering piece 6, in a flat bar shape extending toward the right, is provided to a front side upper edge of the base plate 31 (also refer to FIG. 1). If the stringing occurs while the coating film transfer tool 10 is in use, a scattering coating film layer (namely the glue material) adheres to the glue material adhering piece 6 so as to reduce adhesion of the scattering coating film layer to a front opening edge of an upper part of the housing main body 5. Stringing is a phenomenon in which the coating film layer is stretched like a string between a coating film layer remaining on the transfer tape T and a coating film layer transferred to the transferred surface after the coating film layer is transferred. If the scattered coating film layer adheres to the front opening edge of the upper part of the housing main body 5, the scattered coating film layer may get into the housing main body 5 and may cause operation failure. The glue material adhering piece 6 is for preventing such operation failure.

As described heretofore, the replacement refill 30 includes the base plate 31, the supply bobbin 32, the take-up bobbin 33, and the second head part 26 having the debris removal roller 24. In a state where the replacement refill 30 is removed from the coating film transfer tool main body 100 (namely, in a status of FIG. 2), the transfer tape T of the replacement refill 30 is wound around an end part of the left and right plate connecting part 26c of the second head part 26.

In order to install the replacement refill 30 to the coating film transfer tool main body 100 for using the coating film transfer tool 10, from the status of FIG. 2, first, install the replacement refill 30 to the right casing 52 and close the left casing 51. Next, move the opening and closing operation part 9a (refer to FIG. 1B) of the opening and closing member 9 to a rear side. By doing so, the rack part 9c of the opening and closing member 9 is also moved to the rear side. The pinion part 22d (refer to FIG. 4) of the first head part 22 is rotated since the rack part 9c meshes with the pinion part 22d of the first head part 22. At the time, the second head part 26 is combined with the first head part 22 for constituting the head part 20. Consequently, the head part 20 is inverted by the pinion part 22d being rotated. The transfer roller 23 positioned on the rear side is then arranged to a front side as shown in FIG. 3. When removing the replacement refill 30, move the opening and closing operation part 9a forward so as to invert the head part 20. By doing this, in the head part 20 (the second head part 26), the left and right plate connecting part 26c is positioned on the front side and the transfer roller 23 is positioned on the rear side.

When transferring the coating film layer of the transfer tape T to the transferred surface using the coating film transfer tool 10, the transfer roller 23 should be moved with being pressed against the transferred surface with a certain degree of pressing force. At this time, as shown in FIG. 6, the coating film layer (the glue material in this embodiment) may protrude from any or both of left and right edges T1 and may adhere to the transfer roller 23 as debris of the coating film layer. The debris of the coating film layer adhering to the transfer roller 23 is sent to the rear side with the rotation of the transfer roller 23 and then positioned between the transfer roller 23 and the debris removal roller 24. A roller part 23b of the transfer roller 23 is formed of a silicone material, and the debris removal roller 24 is formed of a hard plastic material. So the debris removal roller 24 is formed of a harder material than a material of the transfer roller 23 (the roller part 23b). In other words, a material of the debris removal roller 24 is more easily adhered than a material of the transfer roller 23 (the roller part 23b). Therefore, the debris of the coating film layer, which adheres to the transfer roller and is positioned between the transfer roller 23 and the debris removal roller 24, adheres and moves to the debris removal roller 24.

In this way, the debris of the coating film layer adhering to the transfer roller 23 moves to the debris removal roller 24 sequentially. The debris adhering to the debris removal roller 24, which is formed of the harder material that is more easily adhered than the material of the transfer roller 23 (the roller part 23b), will not come off easily once it adheres to the debris removal roller 24. Consequently, it is reduced that the debris of the coating film layer gets into an internal mechanism such as the rotation transmission mechanism 60 by adhering back to the used transfer tape T or the like, and causes the operation failure of the coating film transfer tool 10.

In addition, it is prevented that the debris of the coating film layer adhering to the transfer roller 23 makes noise by being pressed against and separated from the transferred surface, such as paper along with the rotation of the transfer roller 23. Furthermore, it is also reduced that the debris of the coating film layer adhering to the transfer roller 23 hinders the rotation of the transfer roller 23 or accumulated debris adheres to the transferred surface, such as paper. Hence, feeling of use of the coating film transfer tool 10 is improved.

In addition, the debris removal roller 24 is disposed to the second head part 26, which is provided to the replacement refill 30, as described heretofore. This means that the debris removal roller 24 to which the debris of the coating film layer adheres is to be discarded with the replacement refill 30 once the replacement refill 30 is used up.

Note that the invention is not limited to the embodiment that has been described heretofore and hence can be freely modified or improved without departing from the spirit and scope of the invention. For example, in this embodiment, the transfer roller 23 and the debris removal roller 24 are arranged in close proximity to each other. However, the transfer roller 23 and the debris removal roller 24 may be arranged at positions where they are in contact with each other depending upon a type of the coating film layer and a form of the transfer tape T.

Figure 7A:
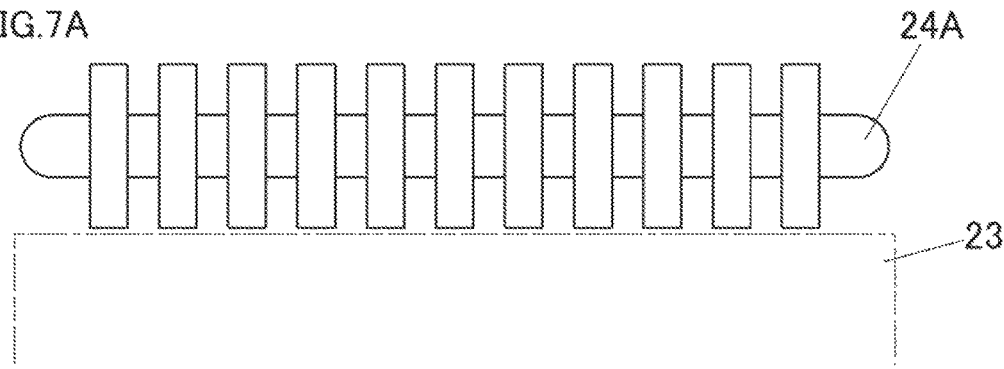
FIG. 7A is a schematic plan view showing a variant of a design of a debris removal roller of the coating film transfer tool according to the embodiment of the present invention.
Figure 7B:
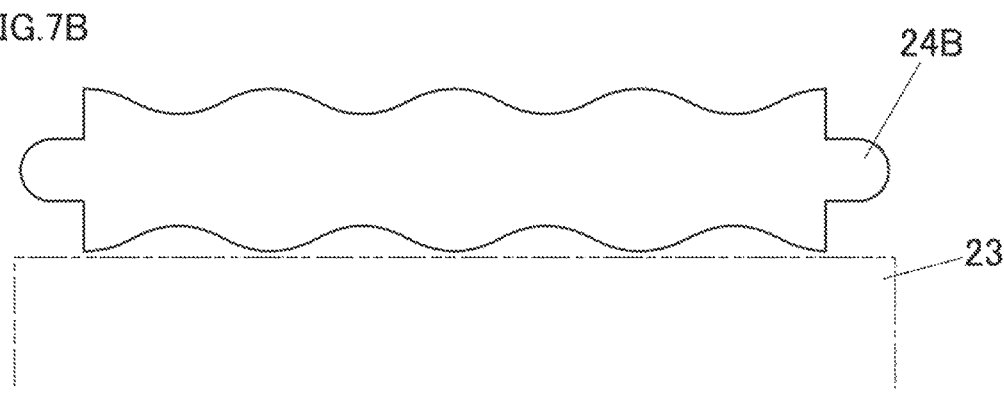
FIG. 7B is a schematic plan view showing a variant of the design of the debris removal roller of the coating film transfer tool according to the embodiment of the present invention.
Figure 7C:
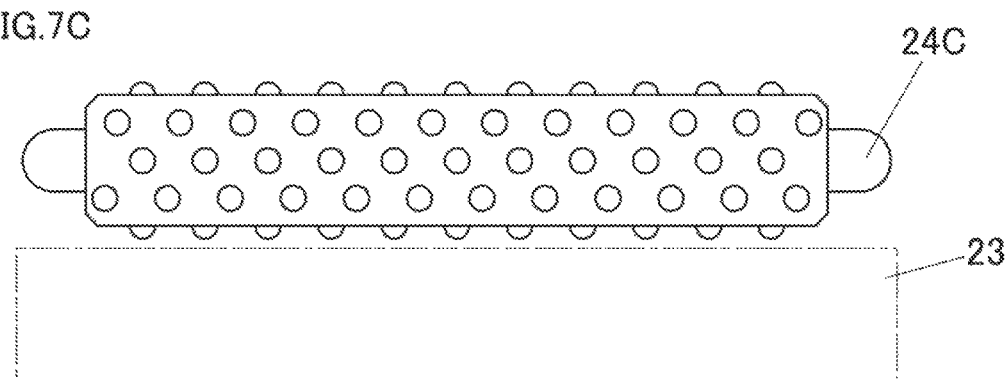
FIG. 7C is a schematic plan view showing a variant of the design of the debris removal roller of the coating film transfer tool according to the embodiment of the present invention.

A shape of the debris removal roller 24 may be formed not only in a substantially circular cylindrical shape in this embodiment, but may also be formed, for example, in a comb-like shape having a plurality of axially aligned circular discs as a debris removal roller 24A as shown in FIG. 7A. In addition, a shape of an axial surface of a debris removal roller 24B may also be formed corrugated as shown in FIG. 7B. Moreover, a large number of small protrusions may be arranged randomly (or regularly) on a surface of a debris removal roller 24C as shown in FIG. 7C.

A diameter of the debris removal roller 24 is formed smaller than a diameter of the transfer roller 23 in this embodiment. However, not limited to this embodiment, the diameter of the debris removal roller 24 may be formed equal to or larger than the diameter of the transfer roller 23. If the diameter of the debris removal roller 24 is formed larger than the diameter of the transfer roller 23, more debris of the coating film layer may adhere to the debris removal roller 24. Conversely, if the diameter of the debris removal roller 24 is formed smaller than the diameter of the transfer roller 23 as shown in this embodiment, the head part 20 can be formed in a compact shape.

The material of the debris removal roller 24 and the transfer roller 23 (the roller part 23b) may be appropriately selected as long as the debris removal roller 24 is more easily adhered than the transfer roller 23. The transfer tape T is the glue tape in this embodiment. However, a correction tape or tapes having different coating film layers may be used.

What is claimed is:

1. A coating film transfer tool comprising:
   a replacement refill body;
   a head part that extends from the replacement refill body;
   a transfer roller that is secured to the head part and configured to rotate in the head part and to abut onto a back side of a transfer tape so as to transfer a coating film layer from the transfer tape to a transferred surface; and
   a debris removal roller that is secured to the head part and configured to rotate, wherein the transfer roller and the debris removal roller are located in the replacement refill body and are offset from one another to form a gap there between, wherein the gap is sized to remove debris of the coating film layer, which adheres to the transfer roller and passes between the transfer roller and the debris removal roller, by adhering debris to the debris removal roller and separating debris from the transfer roller.

2. The coating film transfer tool of claim 1, wherein the debris removal roller is formed of a material having a higher adherence to debris than a material of the transfer roller.

3. The coating film transfer tool of claim 1, wherein the debris removal roller is formed of a harder material than the transfer roller.

4. The coating film transfer tool of claim 2, wherein the debris removal roller is formed of a harder material than the transfer roller.

5. The coating film transfer tool of claim 1, further comprising a coating film transfer tool main body comprising:
   a supply bobbin supported rotatably;
   a take-up bobbin supported rotatably; and
   a rotation transmission mechanism having a plurality of gears and at least one clutch for transmitting rotational force from the supply bobbin around which an unused transfer tape is wound to the take-up bobbin around which a used transfer tape is wound.

6. The coating film transfer tool of claim 2, further comprising a coating film transfer tool main body comprising:
   a supply bobbin supported rotatably;
   a take-up bobbin supported rotatably; and
   a rotation transmission mechanism having a plurality of gears and at least one clutch for transmitting rotational force from the supply bobbin around which an unused transfer tape is wound to the take-up bobbin around which a used transfer tape is wound.

7. The coating film transfer tool of claim 3, further comprising a coating film transfer tool main body comprising:
   a supply bobbin supported rotatably;
   a take-up bobbin supported rotatably; and
   a rotation transmission mechanism having a plurality of gears and at least one clutch for transmitting rotational force from the supply bobbin around which an unused transfer tape is wound to the take-up bobbin around which a used transfer tape is wound.

8. The coating film transfer tool of claim 4, further comprising a coating film transfer tool main body comprising:
   a rotation transmission mechanism having a plurality of gears and at least one clutch for transmitting rotational force from a supply bobbin around which an unused transfer tape is wound to a take-up bobbin around which a used transfer tape is wound.

* * * * *